(12) United States Patent
Ahn et al.

(10) Patent No.: US 9,173,319 B2
(45) Date of Patent: *Oct. 27, 2015

(54) PORTABLE COMMUNICATION DEVICE AND CRADLE APPARATUS THEREOF

(71) Applicant: Samsung Electronics Co., Ltd., Gyeonggi-do (KR)

(72) Inventors: Sung-Ho Ahn, Seoul (KR); Won-Tae Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/067,052

(22) Filed: Oct. 30, 2013

(65) Prior Publication Data

US 2014/0049888 A1 Feb. 20, 2014

Related U.S. Application Data

(63) Continuation of application No. 12/941,559, filed on Nov. 8, 2010, now Pat. No. 8,587,938.

(30) Foreign Application Priority Data

Feb. 5, 2010 (KR) .......................... 10-2010-0011071

(51) Int. Cl.
*G06F 1/16* (2006.01)
*H05K 5/00* (2006.01)
*H05K 7/00* (2006.01)
*H05K 7/16* (2006.01)

(Continued)

(52) U.S. Cl.
CPC ................ *H05K 7/16* (2013.01); *G06F 1/1624* (2013.01); *G06F 1/1692* (2013.01); *H04M 1/0247* (2013.01); *H04M 1/0216* (2013.01); *H04M 1/0237* (2013.01); *H04M 1/72544* (2013.01); *H04M 2250/16* (2013.01)

(58) Field of Classification Search
CPC ... G06F 1/1601; G06F 1/1616; G06F 1/1624; G06F 1/1633; G06F 1/1641; G06F 1/1647; H04M 1/0202; H04M 1/0206; H04M 1/0235; H04M 1/0233; H04M 1/212; H04M 1/0216
USPC .............. 361/679.01, 679.3, 679.56, 679.26, 361/679.27; 455/575.3, 575.4
See application file for complete search history.

(56) References Cited

U.S. PATENT DOCUMENTS 7,546,150 B2 * 6/2009 Makino ...................... 455/575.1
7,583,496 B2 9/2009 Lai
(Continued)

FOREIGN PATENT DOCUMENTS

KR 10-0678215 B1 1/2007

*Primary Examiner* — Anthony Haughton
(74) *Attorney, Agent, or Firm* — Cha & Reiter, LLC

(57) ABSTRACT

Disclosed are a portable communication device and a cradle apparatus for the same. The portable communication device includes a first housing; a second housing with a first display device, the second housing being cradled at a known angle after being swung from the first housing; and a third housing with a second display device, the third housing being stacked with the second housing before the second housing is swung from the first housing, and being extended from a lower edge of the second housing and tilted at a same known angle as the second housing when the second and third housings are extended from the first housing.

20 Claims, 17 Drawing Sheets

(51) Int. Cl.
　　*H04M 1/02*　　　(2006.01)
　　*H04M 1/725*　　(2006.01)

(56) References Cited

U.S. PATENT DOCUMENTS

| | | | |
|---|---|---|---|
| 7,869,843 B2 | 1/2011 | Ladouceur et al. | |
| 8,060,165 B2 | 11/2011 | Kim et al. | |
| 8,149,581 B2 | 4/2012 | Ma et al. | |
| 8,307,510 B2 | 11/2012 | Chuang et al. | |
| 8,369,076 B2 | 2/2013 | Chuang et al. | |
| 8,396,520 B2 | 3/2013 | Jung | |
| 8,587,938 B2 * | 11/2013 | Ahn et al. | 361/679.3 |
| 2006/0139862 A1 * | 6/2006 | Wang et al. | 361/681 |
| 2009/0286574 A1 | 11/2009 | Kim et al. | |
| 2010/0188350 A1 * | 7/2010 | Sawada | 345/173 |
| 2011/0263304 A1 * | 10/2011 | Laido et al. | 455/575.3 |

* cited by examiner

PORTABLE COMMUNICATION DEVICE AND CRADLE APPARATUS THEREOF

CLAIM OF PRIORITY

This Present application is a Continuation of U.S. patent application Ser. No. 12/941,559 filed on Nov. 8, 2010 which claims the benefit under 35 U.S.C. §119(a) of an application entitled "Portable Communication Device And Cradle Apparatus Thereof" filed in the Korean Intellectual Property Office on Feb. 5, 2010 and assigned Serial No. 10-2010-0011071, the contents of which are incorporated by reference, herein.

BACKGROUND

1. Field of the Invention

The present disclosure relates to the field of portable communication devices, and more particularly to a cradle apparatus which includes a first display device, and a second display device cradled at the same angle with the first display device.

2. Description of the Related Art

As expressed herein and as generally known in the art, the term "a portable communication device" refers to a device that allows a user to execute wireless communication with a counterpart while the user carries it. Such a portable communication device may be represented as a HHP (hand-held phone), a CT-2 cellular (cordless) phone, a digital phone (voice over IP), a PCS phone (portable communication system), and a PDA (personal digital assistant), or other similar communication types devices. Typically, a portable communication device is classified into various types according to its external appearance. For example, a portable communication device (or wireless terminal) may be classified into a bar-type terminal, a flip-type terminal or a slide-type terminal according to its external appearance. The above-mentioned portable communication devices essentially include an antenna device, a data input/output device, and a data reception/transmission device. Of course, keypads that allow data input through pushing action by a user's fingers are widely employed as the data input device.

The slide-type wireless terminal includes a main body having a keypad, a sliding body having a display unit, and a sliding module for allowing the sliding body to be slid from the main body.

However, the conventional slide-type wireless terminals have a number of problems that cause inconvenience to the user. For example, a separate cradle is employed in order for a user to conveniently see information displayed on a display device. The cost of the separate cradle represents an additional financial burden to a user. In fact, it is well-known that a user can more conveniently see information items displayed on a display device if the user sees the information items when the display unit is in a tilted position. However, in the past, unless a separate cradle was provided, the user had to grasp main body of a display device and tilt it so as to see information items displayed on the display device in a more convenient manner. Consequently, it is inconvenient for a user to see a picture displayed on a display device on a table or the like unless a cradle is separately provided.

Korean Patent No. 0678215 discloses in detail some configurations of a portable terminal and a sliding cradle apparatus thereof in order to solve the above-mentioned problems.

As shown in FIGS. 1 and 2, which are duplicated from the above-mentioned Korean patent, a sliding cradle apparatus 10 of a portable terminal is shown that includes: a first housing 20 with a plurality of keys 21, and a second housing 30 with a display device 31, which is slid on the first housing 20 in such a manner that the second housing 30 is tiltedly cradled on the first housing 20 after being slid open, wherein the cradle apparatus 10 includes: a first member 50 provided in the first housing 20, a second member 60 anchored to the second housing 30; a sliding guide unit 70 provided between the first and second members 50 and 60 so as to guide the sliding movement of the second housing 30; and a hinge means 80 provided between the first member 50 and the sliding guide unit 70 in such a manner that the second member 60 and the sliding guide unit 70 can be rotated about a hinge axis A1 away from a position where they are arranged opposite to the first member 50.

However, the conventional sliding apparatus of the portable terminal has disadvantages in that since it employs a configuration that requires the second housing be tiltedly cradled after it is slid open to expose the keys on the first housing, the space for installing the keys is restricted. Further, since the display device should be provided only on the second housing, it is impossible to use a large display device.

In addition, since the conventional hinge means includes a hinge arm, a rod, a cam and a coil spring, as shown in FIG. 1 of the aforementioned Korean patent application, a space for installing these components is required, and since the number of components is increased, manufacturing costs and assembling steps are also increased.

Therefore, what is needed is an apparatus that can provide a large display device, and a wide keypad, and which can reduce the number of components so that a resultant product can be miniaturized and manufacturing costs and assembling steps can be reduced.

SUMMARY

Accordingly, the present invention provides a portable communication device and a cradle apparatus thereof, which includes a display device adapted to be tiltedly cradled after being swung, and a second display device adapted to be extended from the first display device and tiltedly cradled at the same angle with the first display device, whereby the first and second display devices can be used as a large display device as well as individual display devices or a part of which may as a keypad. Thus a product in accordance with the principles of the invention can be miniaturized by using the inner spaces of housings, and the number of components can be reduced so that manufacturing costs and assembling steps can be reduced.

Also, the present invention provides a portable communication device and a cradle apparatus thereof including a first display device that is tiltedly cradled after being slid open, and a second display device that is extended from the first display device and tiltedly cradled at the same angle as the first display device, whereby the first and second display devices can provide a large display device which can also be used as a touch screen, for example.

In addition, the present invention provides a portable communication device and a cradle apparatus thereof including a first display device and a second display device, which is adapted to be automatically cradled by elastic force after the first display device is swung, or slid, from the first housing, whereby the use of a resultant product can be enhanced.

In accordance with an aspect of the present invention, there is provided a cradle apparatus for a portable communication device, which includes a first housing, a second housing with a first display device, the second housing being cradled after being swung from the first housing, and a third housing with a second display device, the third housing being stacked with the second housing before the second housing is swung open, and being extended from the second housing and tiltedly cradled after the second housing is swung open, wherein the cradle apparatus includes: a swing hinge unit provided in the second housing so as to allow the swing movement of the second housing; a tilt hinge unit anchored to the first housing so as to allow the swing hinge unit to be tiltedly rotated; and a plurality of link units provided at each of the opposite ends of the swing hinge unit, so that when the swing hinge unit is tiltedly rotated by the tilt hinge unit, the link units are organically tiltedly rotated and perform a seesaw movement in such a manner that the third housing is extended from the second housing and is tiltedly rotated.

In accordance with another aspect of the present invention, there is provided a cradle apparatus for a portable communication device, which includes a first housing, a second housing having a first display device, the second housing being cradled after being slid from the first housing in a state in which the second housing is opposite to the first housing, and a third housing having a second display device, the third housing being stacked with the second housing before the second housing is slid from the first housing, and being extended from the second housing and tiltedly cradled after the third housing is slid, wherein the cradle apparatus includes: a moving plate anchored to the second housing; a sliding unit slidably joined with the moving plate so as to allow the sliding movement of the moving plate; a tilt hinge unit anchored to the first housing so as to tiltedly rotate the moving plate and the sliding unit; and a plurality of link units provided at each of the opposite ends of the sliding unit, so that when the moving plate and the sliding unit are tiltedly rotated, the link units are organically tiltedly rotated and perform a seesaw movement in such a manner that the third housing is extended from the second housing and is tiltedly rotated.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION

Figure 1:
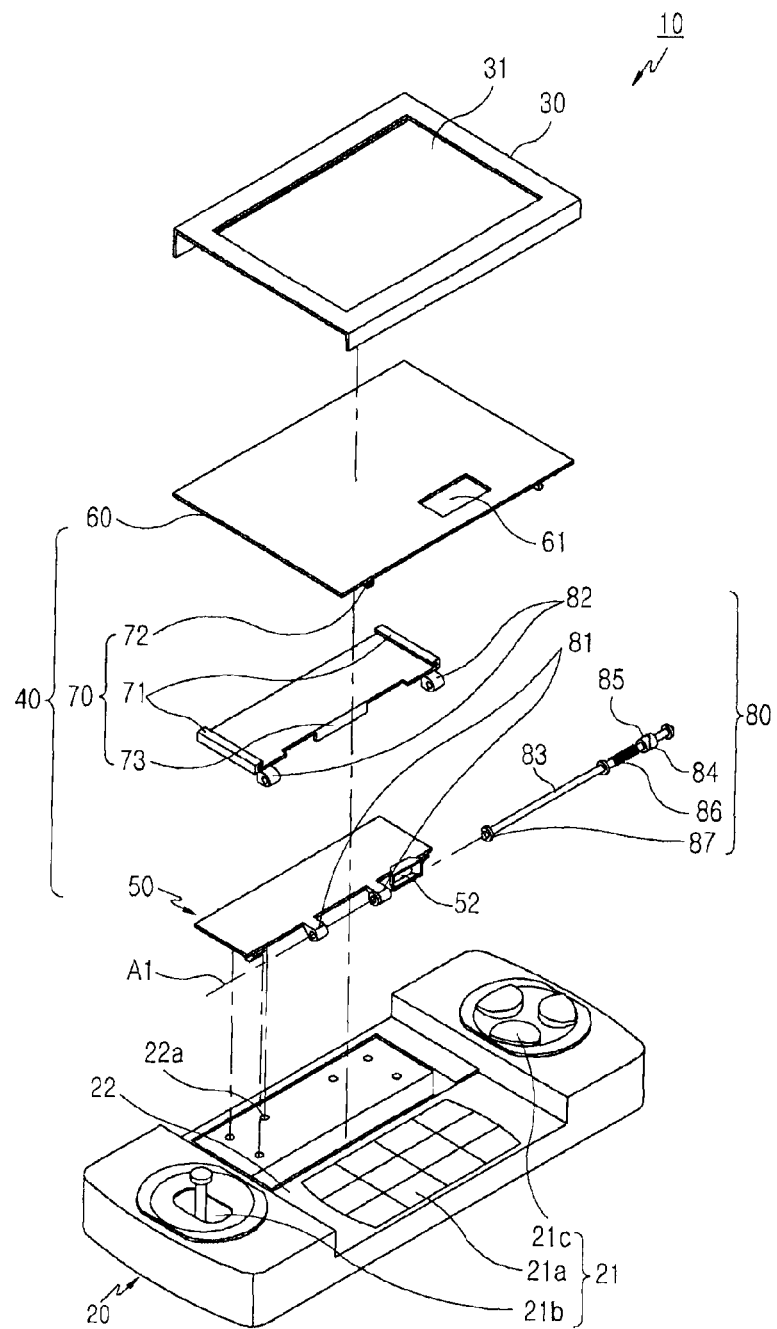
FIG. 1 is an exploded perspective view showing a construction of a sliding cradle apparatus of a conventional portable communication device.
Figure 2:
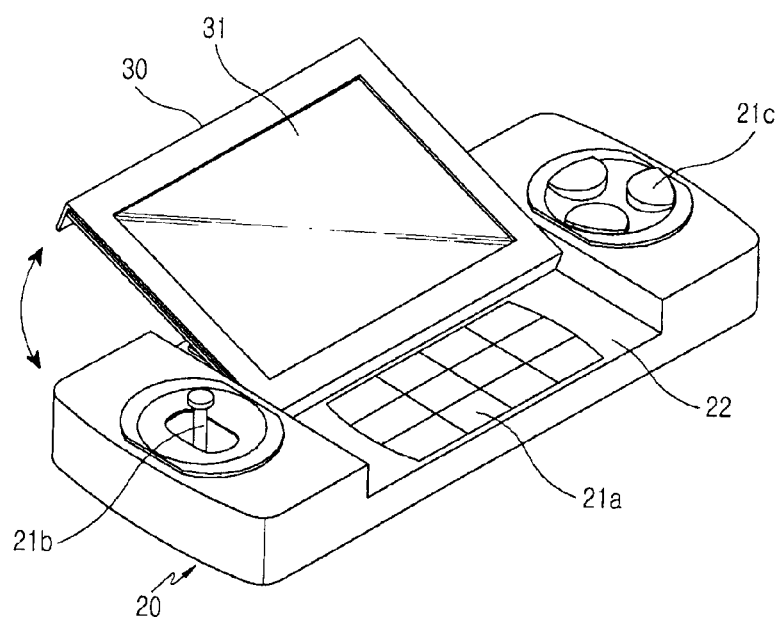
FIG. 2 is a perspective view showing the operation of the sliding cradle apparatus for the conventional portable communication device shown in FIG. 1.

Exemplary embodiments of the present invention will be described with reference to the accompanying drawings. In the following description, various specific definitions found in the following description are provided only to help general understanding of the present invention, and it is apparent to those skilled in the art that the present invention can be implemented without such definitions.

As shown in FIGS. 3 to 15, the inventive cradle apparatus 100 of a portable terminal device includes first, second and third housings 200, 300 and 400, a swing hinge unit 510, a tilt hinge unit 520, and a plurality of link units 530. The second and third housings 300 and 400 are stacked on the first housing 200 in such a manner that the second and third housings 300 and 400 can be supported and tiltedly cradled after they are swung open (or away) from the first housing 200. Furthermore, the third housing 400 is adapted to be extended from the second housing 300 and tiltedly cradled. The second housing 300 includes a first display device 301, and is provided in the first housing 200 in such a manner that the second housing 300 can be tiltedly cradled (i.e., arranged) after it is swung open from the first housing 200, wherein the second housing 300 is staked with the third housing 400. The third housing 400 includes a second display device 401, and is provided in the first housing in such a manner that before the second housing 300 is swung open, the third housing 400 is stacked with the second housing 300 in the first housing 200, and after the second housing 300 is swung open, the third housing 400 can be tiltedly cradled (i.e., arranged) into a state in which it is extended from the second housing 300.

Figure 3:
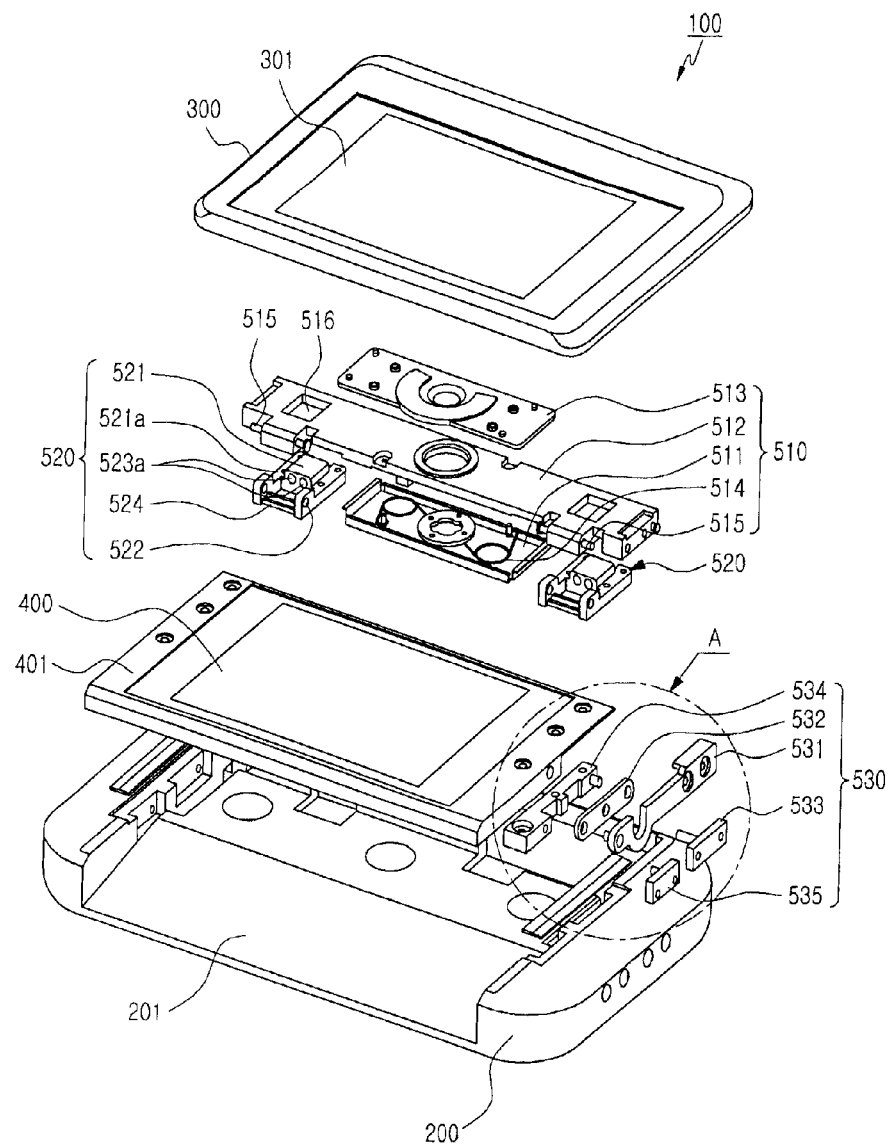
FIG. 3 is an exploded perspective view showing a construction of a cradle apparatus of a portable communication device according to a first embodiment of the present invention.

As shown in FIG. 3, the first housing 200 is formed with a cradle recess 201 so that the third housing 400 can be cradled (i.e., contained) therein The first and second display device 301 and 401 can be used as individual display devices, and if the corresponding second and third housings 300 and 400, respectively, are extended from their cradled position within the first housing, it is possible to form the display devices 301 and 401 as one large display device by arranging the display devices 301 and 401 at the same tilt angle to be flush with each other so that a large display device can be formed. In one aspect of the invention, a portion (or all) of the extended display may be used as a touch screen or as a keypad. Alternatively, the entire screen may be used to display multimedia material.

The third housing 400 is adapted to be extended from the lower edge of the second housing 300, and arranged to be tiled at an angle equal to the tilt angle of the second housing 300.

As shown in FIGS. 3 to 12, the swing hinge unit 510 is provided in the second housing 300 so as to allow the second housing 300 to be swung from the first housing, and the tilt hinge unit 520 is provided in the first housing 200 so as to allow the swing hinge unit 510 to be tiltedly rotated. The link units 530 are provided at each of the opposite ends of the swing hinge unit 510 in such a manner that the link units 530 can be tiltedly rotated, and can perform a seesaw movement when the swing hinge unit 510 is tiltedly rotated by the tilt hinge unit 520, whereby the third housing 400 can be tiltedly rotated in a state in which it is extended from the second housing 300.

As shown in FIGS. 3 to 12, the link units 530 provided at each end of the swing hinge unit 510 include a first, a second, a third, a fourth, and a fifth link units 531, 532, 533, 534 and 535, respectively, wherein the first link unit 531 is provided at one of the opposite ends of the swing hinge unit 510 so that it can be tiltedly rotated by the tilt hinge unit 520, the second link unit 532 is rotatably joined to the first link unit 531 so that the second link unit 532 can be rotated and perform a seesaw movement about a first axis A1 (see FIG. 11) when the first link unit 531 is tiltedly rotated. In addition, the second link unit 531 is rotatably connected to the fourth link unit 534 anchored to the third housing 400, and the third link unit 533 is anchored to the first housing 200 in such a manner that the third link unit 533 provides the first axis A1, and supports the seesaw movement of the second link unit 532. The fourth link unit 534 is anchored to the third housing 400 in such a manner that the third housing 400 can be tiltedly rotated about a second axis A2 (see FIG. 11) in response to the seesaw movement of the second link unit 532, and the fifth link unit 535 is anchored to the first housing 200 in such a manner that the fifth link unit 535 provides the second axis A2 and supports the third housing 400 so that the third housing 400 can be tiltedly rotated.

As shown in FIGS. 3 to 12, the swing hinge unit 510 includes a base member 511, a flat plate 512, a swing plate 513, and a pair of elastic members 514. The base member 511 is anchored to the flat plate 512 to house the elastic members 514, and the flat plate 512 is assembled to the base member 511 (see FIG. 5). The flat plate 512 is assembled opposite to the swing plate 513 so that the flat plate 512 can be tiltedly rotated together with the swing plate 513. The swing plate 513 is assembled with the flat plate 512 to be capable of swinging, and is anchored to the second housing 300 in such a manner that the swing plate 513 can be swung while it is positioned opposite to the flat plate 512. The elastic members 514 are provided in the base member 511 to provide elastic force for allowing the swing plate 513 to be swung.

Each of the elastic members 514 may be formed from any of a coil spring 523b, a wire spring, a leaf spring and a crank shaft. It is also possible to use other elastic members so as to form the elastic members 514.

Figure 7:
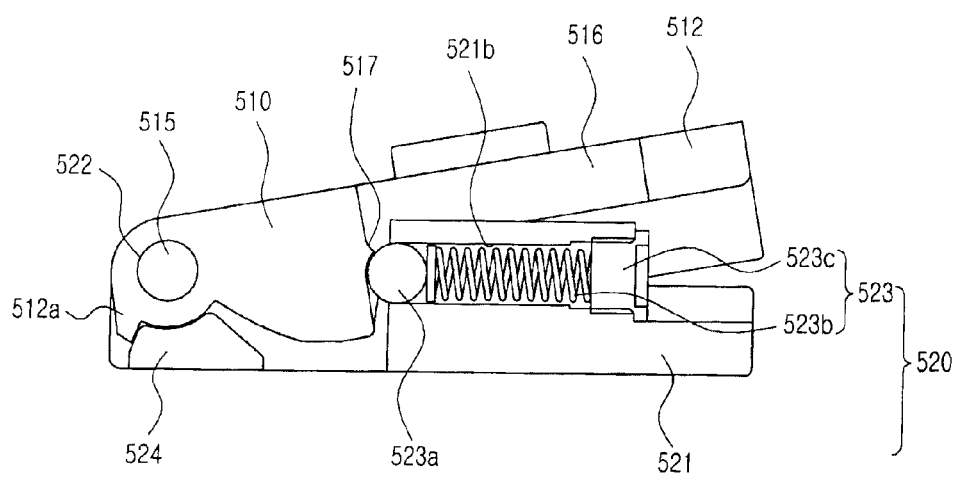
FIG. 7 is a cross-sectional view taken along line A-A' in FIG. 6.

As shown in FIGS. 3 to 12, the tilt hinge unit 520 includes a body housing 521, one or more hinge holes 522 and a hinge unit 523, wherein the body housing 521 has a screwed part 521a so that the body housing 521 can be screwed to the first housing 200, and is adapted to be fitted in or removed from an engagement hole 516 formed in the flat plate 512 when the swing hinge unit 510 is tiltedly rotated (see FIG. 7). The hinge holes 522 are formed on one end of the body housing 521 in such a manner that they can be engaged with a pair of hinge pins 515 formed on the flat plate 512 to be rotatable about a rotation axis and the flat plate 512 can be tiltedly rotated. The hinge unit 523 is provided in the body housing 521 at a position corresponding to that of a cam 517 formed on the flat plate 512, so that the hinge unit 523 renders a ball 523a provided therein to be engaged with or released from the cam 517 in response to the rotation of the flat plate 512. In this manner, rotation of the swing hinge unit 510 is limited and further provides a click feeling.

As shown in FIG. 7, the hinge unit 523 includes a ball 523a, a coil spring 523b, and a spring support 523c. The ball 523a is provided in an actuation hole 521b formed in the body housing 521, and is adapted to be introduced into or extracted from the actuation hole 521b in response to the engagement and release of the cam 517. The coil spring 523b is provided in the actuation hole 521b so that it can provide an elastic force for allowing the ball 523a to be introduced into, or extracted from, the actuation hole 521b. The spring support 523c is provided in the actuation hole 521b so that it can support the elastic force of the coil spring 523b.

As shown in FIGS. 3 and 7, a stopper 521a is formed at an end of the flat plate 512 in such a manner that the stopper 521a comes into contact with a stopper protrusion 524 formed on the tilt hinge unit 520 and limits the rotation of the swing plate 513.

As shown in FIGS. 3 to 12, a first connection part 531a is formed on one end of the first link unit 531 so that the first link unit 531 is joined to one of the opposite ends of the flat plate 512, and a second connection part 531b is formed on the other end of the first link unit 531 so that the first link unit 531 is joined to the second link unit 532 in such a manner that the first link unit 531 can be tiltedly rotated. The first link unit 531 is formed with an engagement recess 531c at the central area thereof, so that the first link unit 531 is engaged with, or disengaged from, the third link unit 533 as the first link unit 531 is tiltedly rotated (see FIG. 4).

Figure 4:
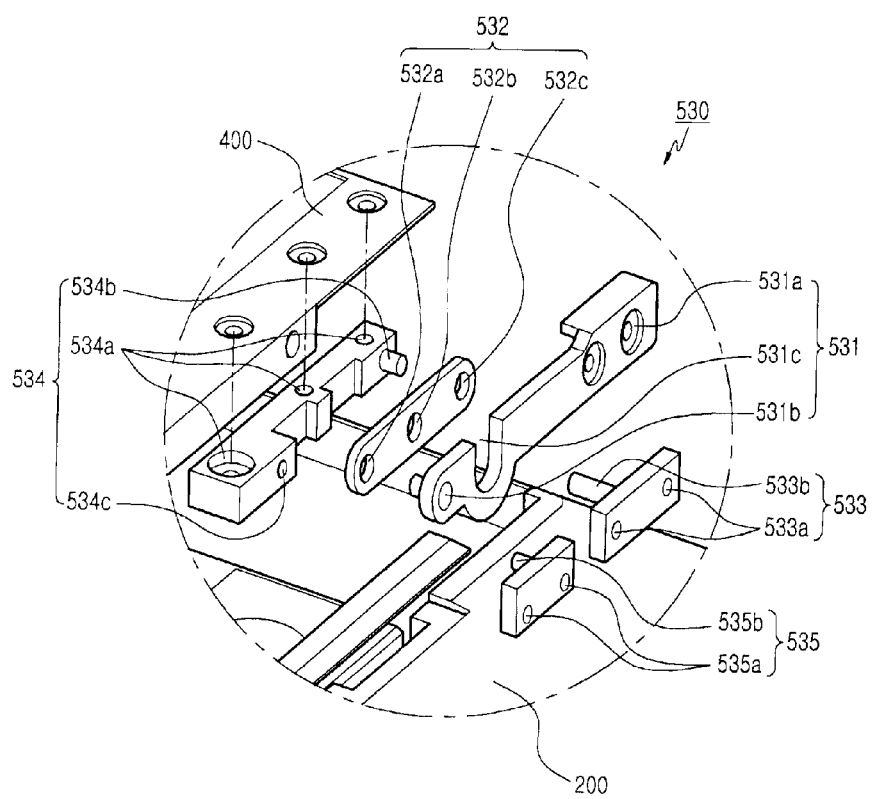
FIG. 4 is an enlarged exploded perspective view of the portion indicated by an arrow A in FIG. 3.
Figure 5:
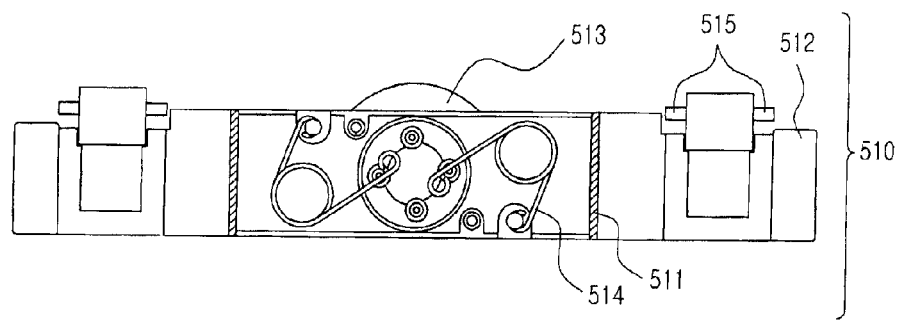
FIG. 5 is a top plan view showing a swing hinge unit in the construction of the cradle apparatus of the portable communication device according to the first embodiment of the present invention.
Figure 6:
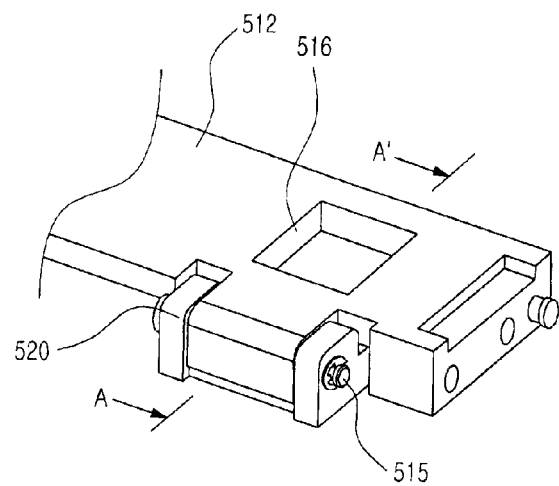
FIG. 6 is a perspective view showing a tilt hinge in the construction of the cradle apparatus of the portable communication device according to the first embodiment of the present invention.
Figure 10:
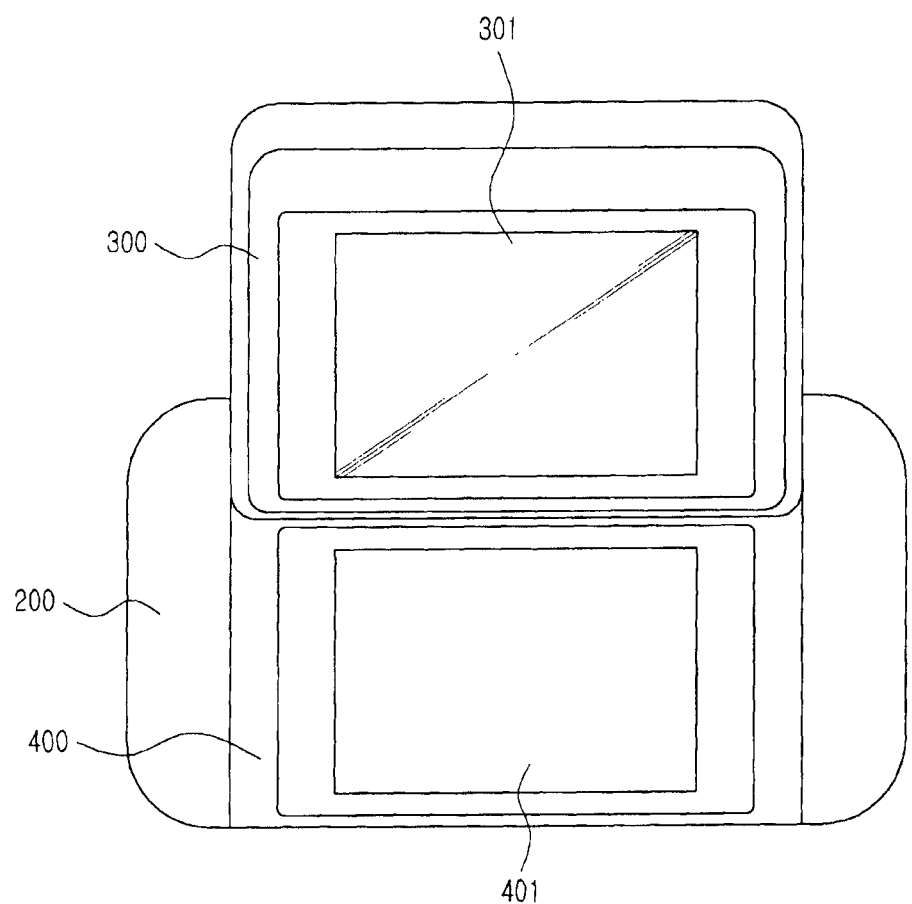
FIG. 10 is a top plan view showing the cradle apparatus of the portable communication device according to the first embodiment of the present invention after operating the cradle apparatus.
Figure 11:
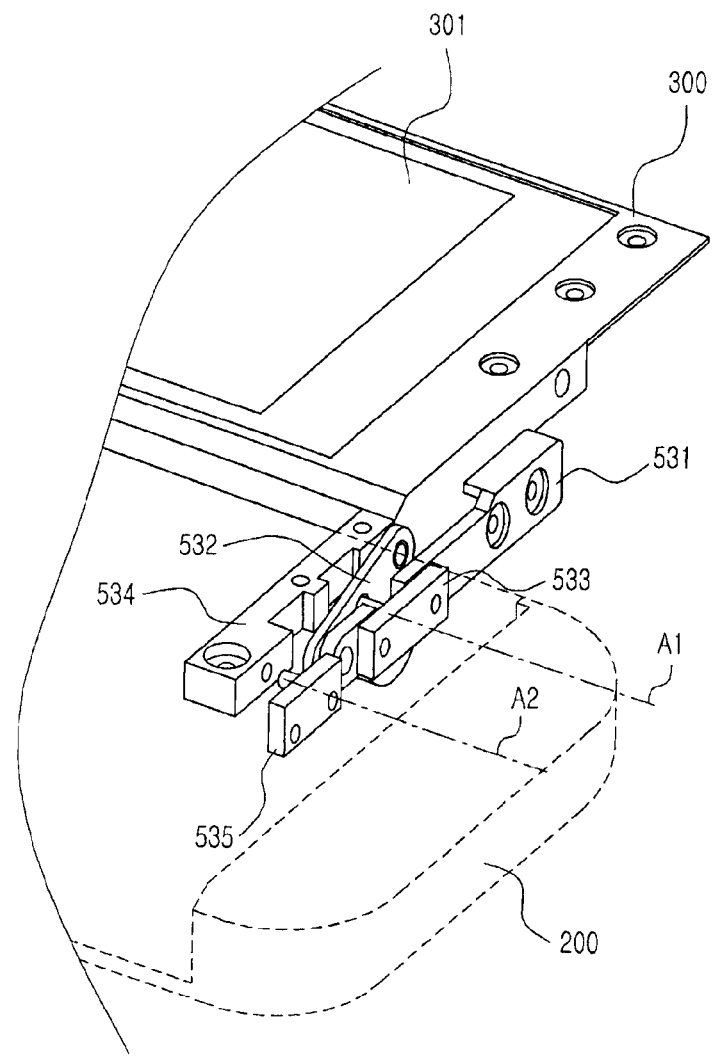
FIG. 11 is a perspective view showing the operation of a plurality of link units in the construction of the cradle apparatus of the portable communication device according to the first embodiment of the present invention.

As shown in FIGS. 3 to 12, the second link unit 532 has a first link hole 532a formed at one end thereof, wherein the first link hole 532a is joined with the second connection part 531b formed in the first link unit 531 in such a manner that the second link unit 532 can be tiltedly rotated, the second link unit 532 has a second link hole 532b formed at the center thereof, wherein a rotary protrusion 533b formed on the third link unit 533 extends through the second link hole 532b so as to support the second link unit 532 in such a manner that the second link unit 532 can be rotated and perform a seesaw (i.e., pivot) movement about the second axis A2, and the second link unit 532 has a third link hole 532c formed at the other end thereof so that the third link hole 532c can be rotatably joined to a rotary joint protrusion 534b formed on the fourth link unit 534 (see FIGS. 4, 11).

As shown in FIGS. 3 to 12, the third link unit 533 is included of at least one third link unit side connection part 533a, and a rotary protrusion 533b, wherein the third link unit side connection part 533a is joined to the first housing 200 so as to support the second link unit 532, and the rotary protrusion 533b is formed at the center of the third link unit 533 so as to provide the first axis A1 and to be rotatably engaged in the second link hole 532b (see FIGS. 4, 11).

As shown in FIGS. 3 to 12, the fourth link unit 534 is included of at least one fourth link unit side connection part 534a, a rotary joint protrusion 534b, and a rotary joint groove 534c, wherein the fourth link unit side connection part 534a is joined to the third housing 400 so as to support the third housing 400 in such a manner that the third housing 400 can be tiltedly rotated in response to the seesaw movement of the second link unit 532, the rotary joint protrusion 534b is formed at one end of the fourth link unit 534 so that the rotary joint protrusion 534b is rotatably joined to the third link hole 532c formed at the other end of the second link unit 532, and the rotary joint groove 534c is formed at the other end of the fourth link unit 534 so that the rotary joint groove is rotatably joined with a rotary protrusion 535 of the fifth link unit 535 (see FIG. 4).

As shown in FIGS. 3 to 12, the fifth link unit 535 includes at least one fifth link unit side connection part 535a, and a rotary protrusion 535b, wherein the fifth link unit side connection part 535a is anchored to the first housing 200 so as to support the third housing 400 so that the third housing 400 can be tiltedly rotated. The rotary protrusion 535b is rotatably joined to the rotary joint groove 534c of the fourth link unit 534 so as to allow the rotation of the third housing 400, and provides the second axis A2 (see FIG. 4, 11).

Figure 13:
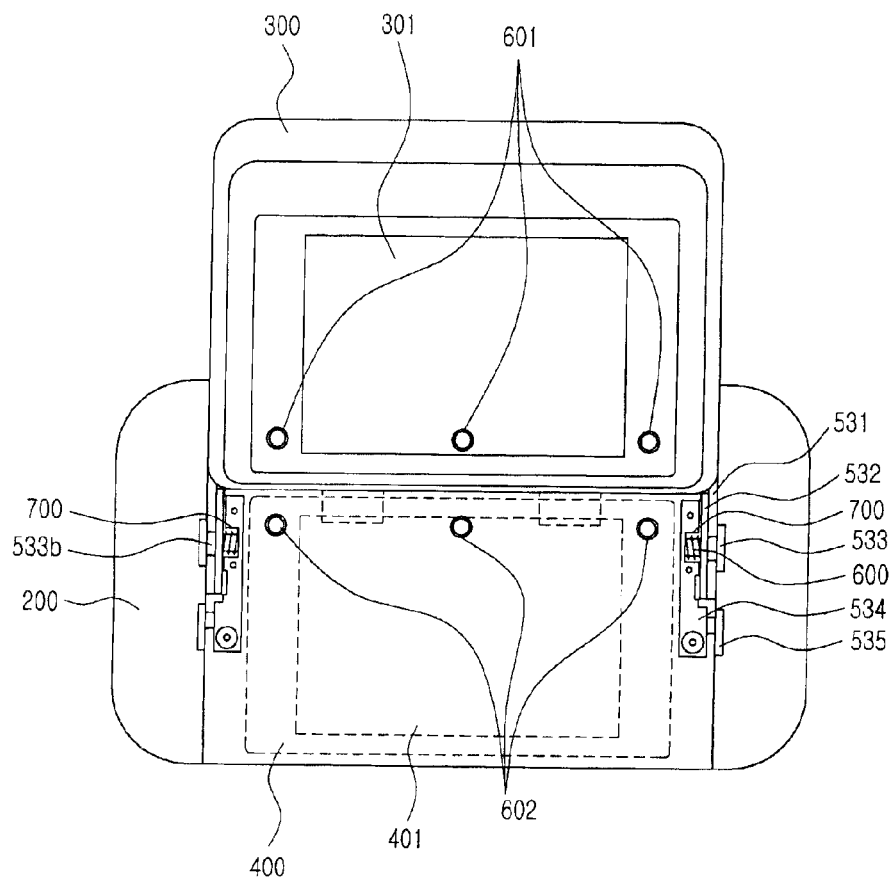
FIG. 13 is a top plan view showing first, second and third elastic members in the construction of the cradle apparatus of the portable communication device according to the first embodiment of the present invention.
Figure 14:
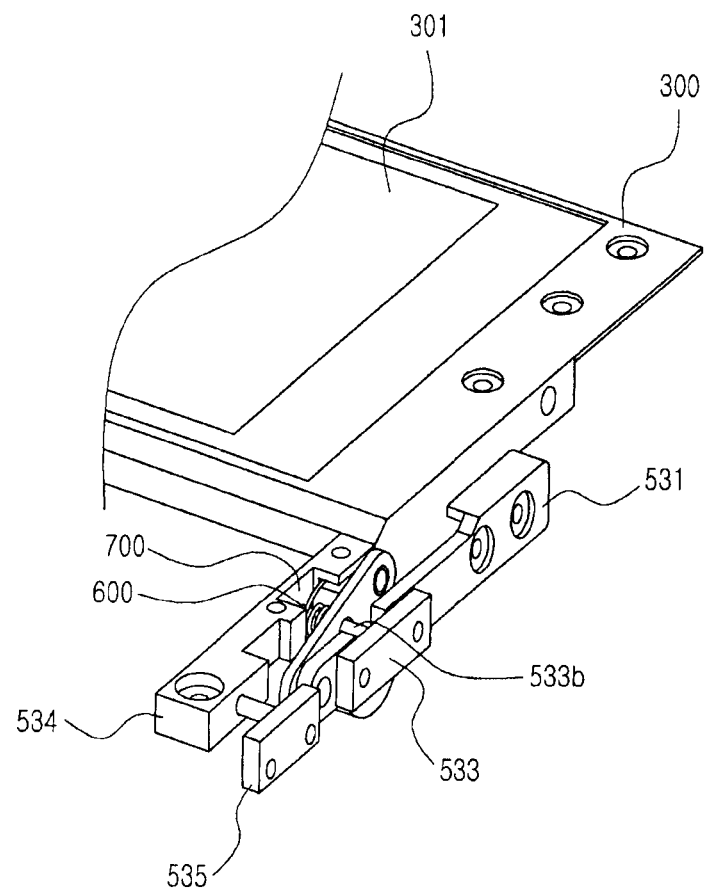
FIG. 14 is a perspective view showing the connection of the first elastic member to the plural link units in the construction of the cradle apparatus of the portable communication device according to the first embodiment of the present invention.
Figure 15:
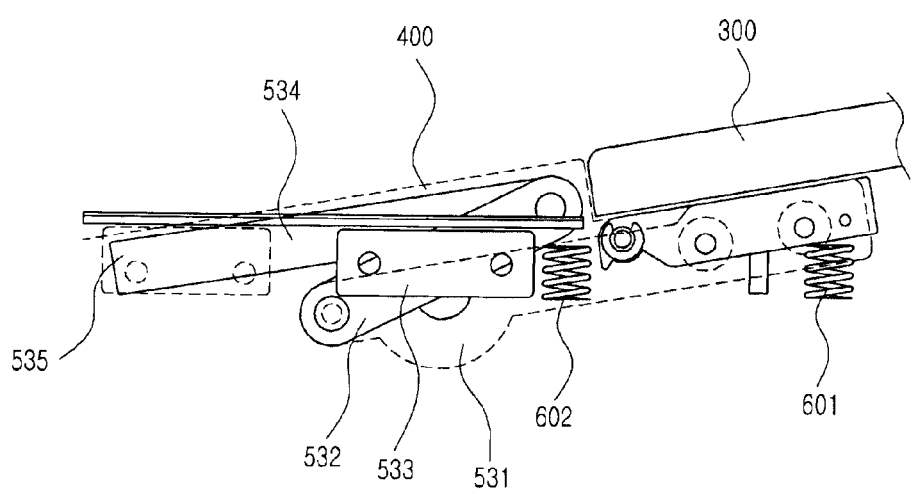
FIG. 15 is a longitudinal cross-sectional view showing the second and third elastic members in the construction of the cradle apparatus of the portable communication device according to the first embodiment of the present invention.

As shown in FIGS. 13 to 15, at least one first elastic member 600 is provided between the second and fourth link units 532 and 534, so that the third housing 400 can be automatically tiltedly rotated by an elastic force produced by the first elastic member 600.

As shown in FIG. 15, at least one second elastic member 601 and at least one third elastic member 602 are provided under the second link unit 532 and the fourth link unit 534, respectively, so that the third housing 400 can be automatically rotated due to elastic force produced by the corresponding elastic member.

As shown in FIG. 13, the first elastic member 600 is provided within a space 700 formed in the fourth link unit 534, wherein the rotary protrusion 533b is fitted in the first elastic member 600, so that the first elastic member 600 provides the fourth link unit 534 with an elastic force.

A portable terminal device, to which the cradle apparatus according to the first embodiment of the present invention is applied, is illustrated as a representative example in the above. However, the portable communication device is not necessarily limited to a mobile communication terminal, and the cradle apparatus can be applied to various other types of terminals that can employ such a cradle apparatus.

For example, a portable communication device, to which the cradle apparatus according to the first embodiment of the present invention can be applied, may include any type of information communication devices and multimedia devices, such as a PMP (Portable Multimedia Player), an MP3 player, a navigation system, a game machine, a notebook computer, a sign board, a TV set, a digital broadcasting player, a PDA (Personal Digital Assistant), and a smart phone, and application devices thereof.

Now, the operation of the cradle apparatus of a portable communication device according to the first embodiment of the present invention will be described in more detail with reference to FIGS. 3 to 15.

As shown in FIGS. 3 to 12, the cradle apparatus 100 of a portable communication device includes a first housing 200, a second housing 300 with a first display device 301, a third housing with a second display device 401, a swing hinge unit 510, a tilt hinge unit 520, and a plurality of link units 530.

The third housing 400 is cradled (contained) in a cradle recess 201 formed on the first housing 200, and the second housing 300 is stacked on the top of the third housing 400 to be capable of swinging out from the first housing.

Here, the swing hinge unit 510 includes a base member 511, a flat plate 512, a swing plate 513, and a pair of elastic members 514. The base member 511 is anchored to the flat plate 512 to house the elastic members 514. The swing plate 513 is assembled to the base member 511 to be positioned opposite to the top surface of the flat plate 512. The swing plate 513 is anchored to the second housing 300.

The tilt hinge unit 520 includes a body housing 521, at least one hinge hole 522, and a hinge unit 523. The body housing is screwed to the first housing 200 via a screwed part 521a.

As shown in FIG. 7, the hinge unit 523 is included of a ball 523a, a coil spring 523b, and a spring support 532c.

As shown in FIGS. 3 to 12, the link units 530 includes first, second, third, fourth and fifth link units 531, 532, 533, 534 and 535, respectively. Such link units are provided on each of the opposite ends of the flat plate 512

A first connection 531a formed on one end of the first link unit 531 is joined to an opposite end of the flat plate 512, and a second connection part 531b formed on the other end of the first link unit 531 is rotatably joined to one end of the second link unit 532. A rotary protrusion 533b is joined to an engagement recess 531c formed at the central area of the first link unit 351.

A first link hole 532a formed on one end of the second link unit 532 is rotatably engaged with the second connection part 531b formed on the first link unit 531, and a second link hole 532b formed at the central area of the second link unit 532 is rotatably joined to a rotary protrusion 533b formed on the third link unit 533.

A third link hole 532c formed at the other end of the second link unit 532 is rotatably joined to a rotary joint protrusion 534c formed on the fourth link unit 534.

In this state, the third link unit side connection part 533a is joined to the first housing 200.

In this state, a rotary joint protrusion 534b formed at one end of the fourth link unit 534 is rotatably joined to a third link hole 532c formed at the other end of the second link unit 532, a rotary joint groove 534c formed at the other end of the fourth link unit 534 is rotatably joined to a rotary protrusion 535b formed on the fifth link unit 535. The fourth link unit side connection part 534a is connected to the third housing 400.

In this state, a rotary protrusion 533b on the fifth link unit 535 is rotatably joined to the rotary joint groove 534c of the fourth link unit 534. The fifth link unit side connection part 535a is connected to the first housing 200.

In this state, as shown in FIGS. 9 to 12, if the second housing 300 is swung from the first housing 200, the second housing 300 is swung together with the swing plate 513, the second housing 300 is lifted upward from the first housing 200, and then the second housing 300 is tiltedly rotated while being lifted by the tilt hinge unit 520. At this time, the swing plate 513 and the flat plate 512 are also rotated tiltedly upward.

Figure 12:
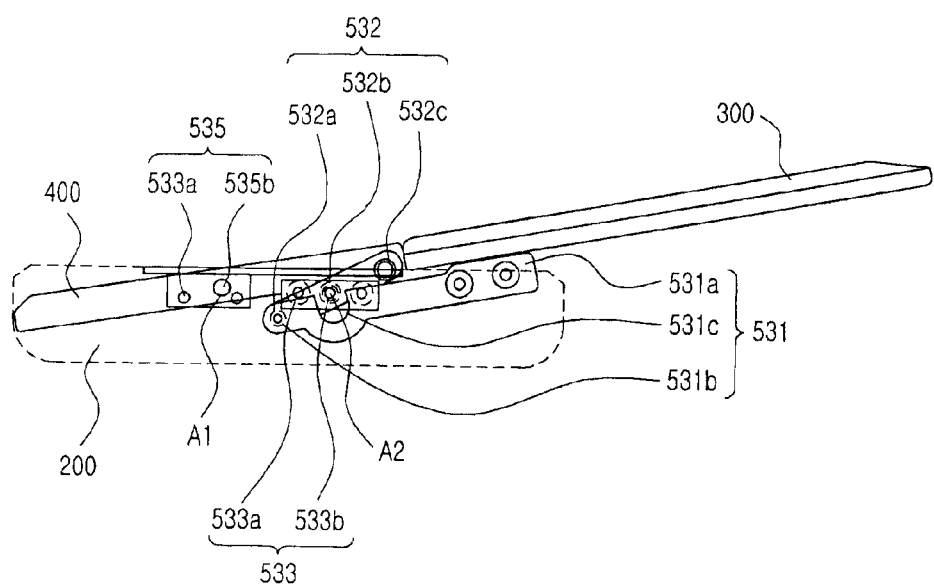
FIG. 12 is a longitudinal cross-sectional view showing the operation of the cradle apparatus of the portable communication device according to the first embodiment of the present invention.

At this time, the cam 517 of the flat plate 512 is also rotated tiltedly upward while the flat plate 512 is being tiltedly rotated, as shown in FIGS. 7 and 12. The cam 517 renders the ball 523a of the tilt hinge unit 520 to be introduced into the actuation hole 521b while the cam 517 is going over the ball 523a, and if the cam 517 went over the ball 523a, the ball 523a is extracted again, thereby providing a click feeling and limiting the rotation of the flat plate 512.

At this time, since a stopper 512a is formed at one end of the flat plate 512, the stopper 512 comes into contact with a stopper protrusion 524 formed on the tilt hinge unit 520, thereby limiting the rotation of the flat plate 512.

At this time, while the flat plate 512 is being tiltedly rotated, the first link unit 531 is also tiltedly rotated, and the first link unit 531 tiltedly rotates one end of the second link unit 532.

At this time, the engagement recess 531c formed at the center of the first link unit 531 is engaged with or disengaged from the rotary protrusion 533b of the third link unit 533.

While being tiltedly rotated, the first link unit 531 rotates one end of the second link unit 532 downward about the first axis A1 of the third link unit 533.

At this time, the other end of the second link unit 532 is lifted through a seesaw movement. The other end of the second link unit 532 tiltedly rotates the fourth link unit 534 and while lifting the fourth link unit 534 the fourth link unit 534 tiltedly rotates the third housing 400.

At this time, the fifth link unit 535 lifts and tiltedly rotates the fourth link unit 534 about the second axis A2, and also tiltedly rotates the fourth housing 400. The first, second, third, fourth and fifth link units 531, 532, 533, 534 and 535 are tiltedly rotated so as to tiltedly rotate the swing plate.

The third housing 400 is extended from the second housing 300 and tiltedly cradled, wherein the second and third housings 300 and 400 are arranged in the same tilt angle to be flush with each other.

In this state, as shown in FIGS. 10 to 12, the first display device 301 of the second housing 300 and the second display device 401 of the third housing 400 are arranged to be flush with each other so that they may be used as a large screen, wherein the large screen can be used to display multi-media or as a touch screen or a keypad.

Furthermore, the first and second display devices 301 and 401 may be used as individual display devices.

Figure 8:
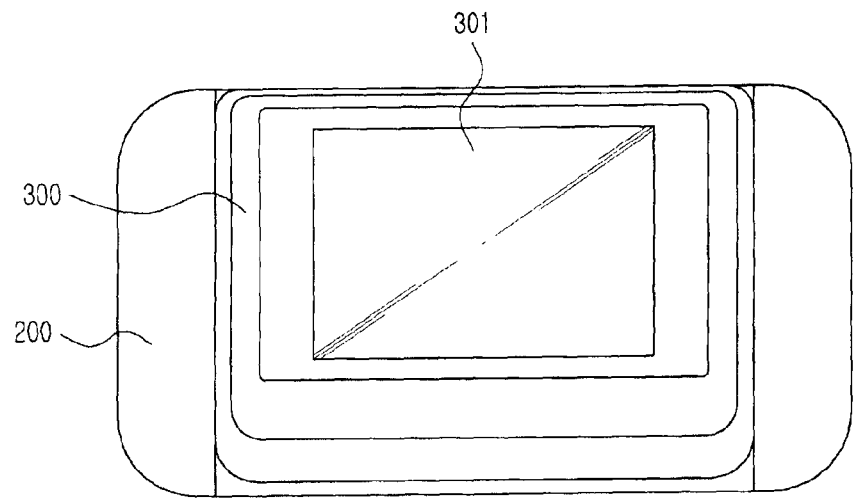
FIG. 8 is a top plan view showing the cradle apparatus of the portable communication device according to the first embodiment of the present invention prior to operating the cradle apparatus.
Figure 9:
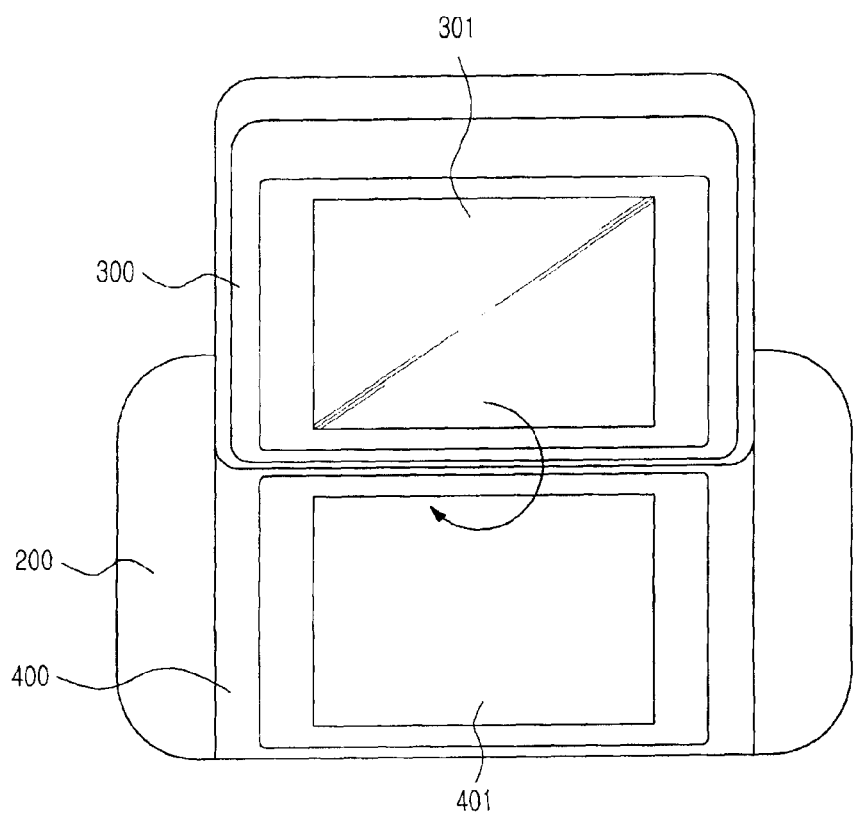
FIG. 9 is a top plan view showing the swing operation of a second housing in the construction of the cradle apparatus of the portable communication.

Here, as shown in FIG. 8, when the second and third housings 300 and 400 are returned to their original positions, if the housing 300 is lowered downward, the swing hinge unit 410 and the tilt hinge unit 520 are also lowered downward in unison, and the flat plate 512 and the first link unit 531 are also lowered in unison.

At this time, as shown in FIG. 7, the cam 517 of the flat plate 512 is also lowered, and the cam 517 renders the ball 523a to be introduced into or extracted from the actuation hole 521b, thereby providing a click feeling for the flat plate 512 and limiting the rotation of the flat plate 512.

As shown in FIGS. 3 to 12, the other end of the first link unit 531 is lifted again, thereby being returned to its original position, wherein the other end of the first link unit 531 lifts one end of the second link unit 532 and lowers the other end of the second link unit 532 through a seesaw movement. The second link unit 532 rotates about the first axis A1, thereby performing a seesaw (or pivoting) movement.

If the other end of the second link unit 532 is lowered, the fourth link unit 534 is also lowered together with the second link unit 532, and as the fourth link unit 534 is lowered, the third housing 400 is also lowered to its original position.

The fourth link unit 534 is lowered by being rotated about the second axis A2 of the fifth link unit 535.

In this state, the second housing 300 is swung closed, so that the second and third housings 300 and 400 are stacked to be positioned opposite to each other.

In addition, as shown in FIGS. 13 to 15, since at least one first elastic member 600 is provided between the second and fourth link units 532 and 534 so as to automatically rotate the third housing 400 through the elastic force of the first elastic member 600, the second and third housings 300 and 400 are automatically cradled by the elastic force of the first elastic member 600 after the third housing 400 is swung open.

As shown in FIGS. 13 and 14, the first elastic member 600 is provided within a space formed in the fourth link unit 534, and the rotary protrusion 533b formed on the third link unit 533 is fitted in the first elastic member 600, so that the first elastic member 600 provides elastic force to the fourth link unit 534.

In addition, as shown in FIG. 15, since at least one second elastic member 601 and at least one third elastic member 602 are provided below the second and third housings 300 and 400, respectively, the second and third housings 300 and 400 are also tiltedly cradled by the elastic force of the second and third elastic members 601 and 602 after the third housing 400 is swung from the first housing.

Now, the construction and operation of a cradle apparatus of a portable communication device according to a second embodiment of the present invention will be described in more detail with reference to FIGS. 16 to 19. In this exemplary second embodiment, common elements that have been previously described and illustrated are omitted to avoid unnecessary duplication of disclosure. Accordingly reference is made to FIGS. 3-15 and the description thereof for subject matter that is common to the two embodiments of the invention described herein.

As shown in FIGS. 16 to 19, the cradle apparatus 800 of a portable communication device includes first, second and third housings 200, 300 and 400, respectively, a moving plate 801, a sliding unit 802, a tilt hinge unit 520, and a plurality of link units 530.

The second and third housings 300 and 400 are stacked on the first housing 200, wherein the second housing 300 is supported in such a manner that it can be tiltedly cradled after being slid from the first housing, and the third housing 400 is adapted to be extended from the second housing 300.

The second housing 300 includes a first display device 301, wherein the second housing 300 is provided in the first housing 200 in such a manner that it is tiltedly cradled after being slid from the first housing 200, and is stacked onto of the third housing 400.

The third housing 400 has a second display device 401, wherein the third housing 400 is provided in the first housing 200 in such a manner that before the second housing 300 is slid, the third housing 400 is stacked with the second housing 300, and after the second housing 300 is slid, the third housing 400 is extended from a lower edge of the second housing 300 and tiltedly cradled.

A cradle recess 201 is formed in the first housing 200 so as to cradle the third housing 400.

Figure 19:
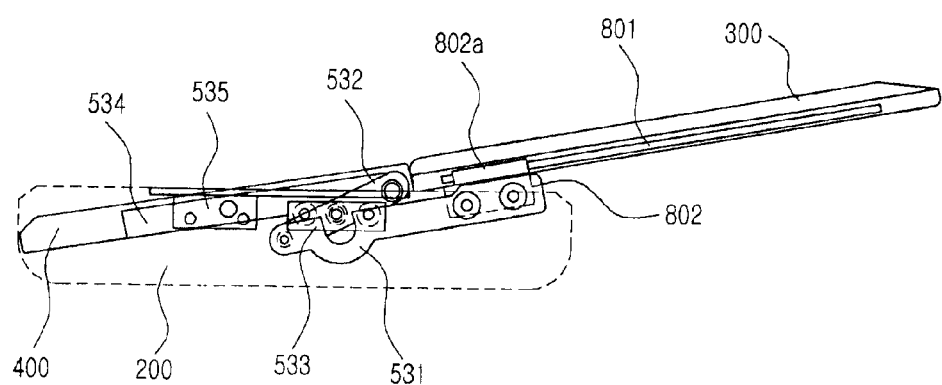
FIG. 19 is a longitudinal cross-sectional view showing the operation of the cradle apparatus of the portable communication device according to the second embodiment of the present invention.

As shown in FIG. 19, the first and second display devices 301 and 401 can be used as individual display devices, wherein if the second and third housings 300 and 400 are arranged to be flush with each other with the same tilt angle, a large screen can be formed, which can be used as a touch screen or a keypad.

As shown in FIG. 19, the third housing 400 is adapted to be extended from the lower edge of the second housing 300 and to be tilted at an angle equal to the tilt angle of the second housing 300.

As shown in FIGS. 16 to 19, the moving plate 801 is assembled to the second housing 300 so as to allow the second housing 300 to be slid by a sliding unit 802 which will be described later. The sliding unit 802 is assembled to the moving plate 801 in such a manner that the sliding unit 802 allows the sliding movement of the moving plate 801. The tilt hinge unit 520 is joined to the first housing 200 with the sliding unit 802 in such a manner that the tilt hinge unit 520 can tiltedly rotate the sliding unit 802.

The tilt hinge unit 520 is formed with at least one hinge hole 522 (similar to that shown in FIG. 7), to which a pair of hinge pins 802b provided on the moving plate 801 is joined in such a manner that the tilt hinge unit 520 can be rotated about a rotary axis. The link units 530 are provided at each of the opposite ends of the sliding unit 802 in such a manner that when the moving plate 801 and the sliding unit 802 are tiltedly rotated, the link units 530 are organically tiltedly rotated and perform seesaw movement, so that the third housing 400 can be tiltedly rotated while it is extended from the second housing 300.

As shown in FIGS. 16 to 19, the link units 530 provided at each side of the sliding unit 801 include first, second, third, fourth and fifth link units 531, 532, 533, 534 and 535. The first link unit 531 is provided at one of the ends of the sliding unit in such a manner that the link unit 531 can be tiltedly rotated by the tilt hinge unit 520 when the moving plate 801 is slid. The second link unit 532 is rotatably joined to the first link unit 531 in such a manner that when the first link unit 531 is tiltedly rotated, the second link unit 532 can be rotated about the first axis A1 (similar to that shown in FIG. 11) and perform a seesaw movement, and the second link unit 532 is rotatably joined to the fourth link unit 534 which is anchored to the third housing 400. The third link unit 533 is anchored to the first housing in such a manner that the third link unit 533 provides the first axis A1 and supports the seesaw movement of the second link unit 532. The fourth link unit 534 is anchored to the third housing 400 so as to tiltedly rotate the third housing 400 about the second axis A2 in response to the seesaw movement of the second link unit 532. The fifth link unit 535 is anchored to the first housing 200 so as to provide the second axis A2 (similar to that shown in FIG. 11) and to support the third housing 400 in such a manner that the third housing 400 can be tiltedly rotated.

In this state, as shown in FIG. 19, if the second housing 300 is slid away from the first housing 200, the second housing 300 is slid together with the moving plate 801. Since the moving plate 801 is slidably joined by a guide movement part 802a formed on the sliding unit 802, the guide movement part 802a also slides the moving plate 801 when the second housing 300 is slid from the first housing.

In this state, the second housing 300 is tiltedly rotated by the tilt hinge unit 520. At this time, the moving plate 801 and the sliding unit 802 are also rotated tiltedly upward in unison.

At this time, the cam 517 of the sliding unit is also rotated tiltedly upward as the sliding unit 802 is tiltedly rotated (see FIG. 7). The cam 517 renders the ball 523a to be introduced into the actuation hole 512b while the cam is going over the ball 532a, and after the cam 517 goes over the ball 523a, the ball 532a is extracted again, thereby providing a click feeling and limiting the rotation of the sliding unit 802.

At this time, since a stopper 512a is formed at one end of the sliding unit 802, the stopper 512a comes into contact with a stopper protrusion 524 formed on the tilt hinge unit 520, thereby limiting the rotation of the sliding unit 802.

At this time, as the sliding unit 802 is tiltedly rotated, the first link unit 531 is also tiltedly rotated, and the first link unit 531 tiltedly rotates one end of the second link unit 532.

At this time, the engagement recess 531c formed at the center of the first link unit 531 is engaged with or disengaged from the rotary protrusion 533b of the third link unit 533.

While being tiltedly rotated, the first link unit 531 rotates downward one end of the second link unit 532 about the first axis A1 of the third link unit 533.

At this time, the other end of the second link unit 532 is lifted through a seesaw movement. The other end of the second link unit 532 lifts and tiltedly rotates the fourth link unit 534, and the fourth link unit 534 tiltedly rotates the third housing 400.

At this time, the fifth link unit 535 lifts and tiltedly rotates the fourth link unit 534 about the second axis A2, (see FIG. 11) and also tiltedly rotates the third housing 400.

The third housing 400 is extended from the second housing 300, wherein the second housing 300 and the third housing 400 are arranged at the same tilt angle to be flush with each other.

In this state, the first display device 301 of the second housing 300 and the second display device 401 of the third housing 400 are arranged to be flush with each other so that they can be used as a large screen, which can be used as a touch screen or a keypad.

In addition, the first and second display devices 301 and 401 can be used as individual display devices.

The first, second, third, fourth and fifth link units 531, 532, 533, 534 and 535 are tiltedly rotated so as to tiltedly rotate the moving plate 801 and the sliding unit 802.

Figure 16:
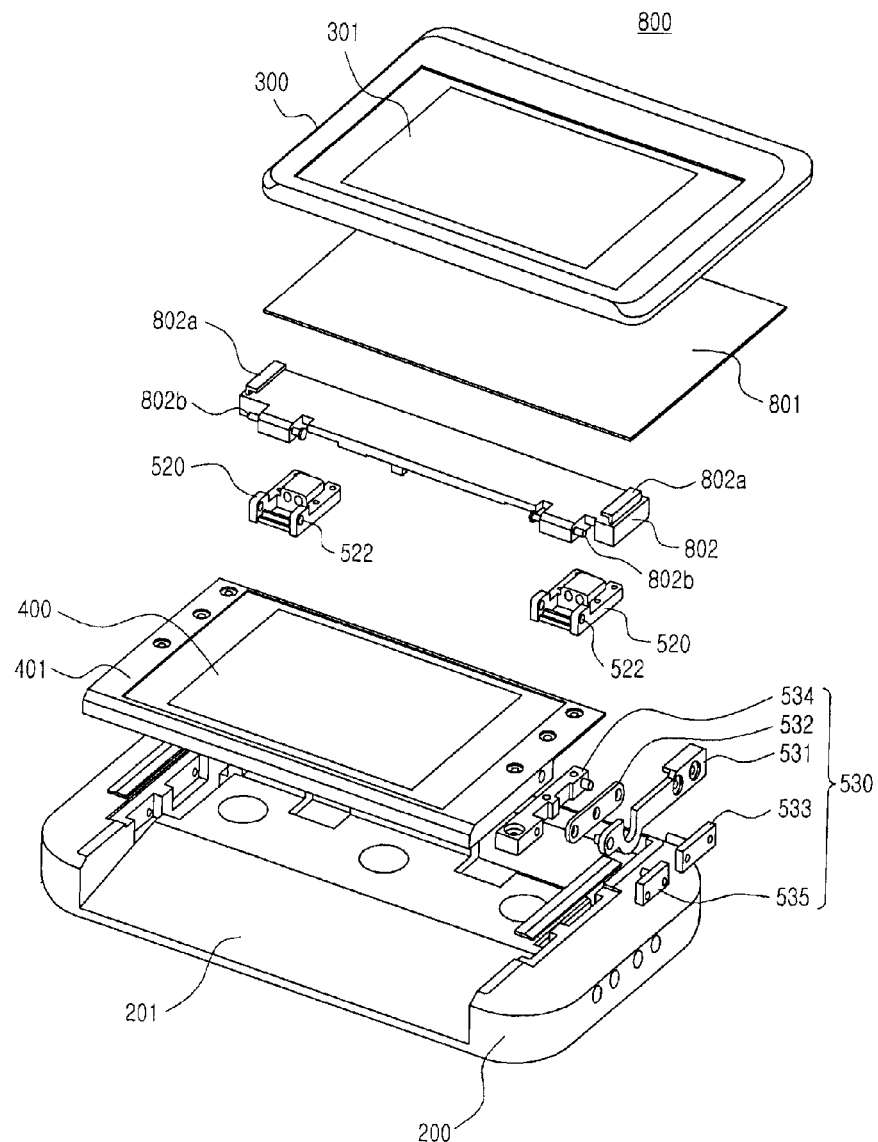
FIG. 16 is an exploded perspective view showing the construction of a cradle apparatus of a portable communication device according to a second embodiment of the present invention.
Figure 17:
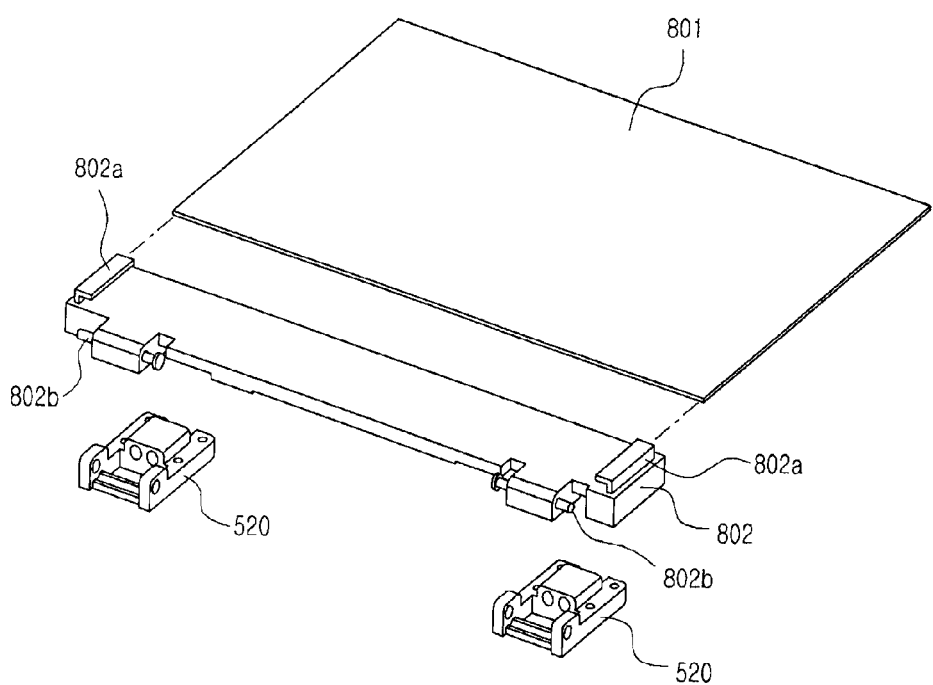
FIG. 17 is an enlarged exploded perspective view showing the construction of the cradle apparatus of the portable communication device according to the second embodiment of the present invention.
Figure 18:
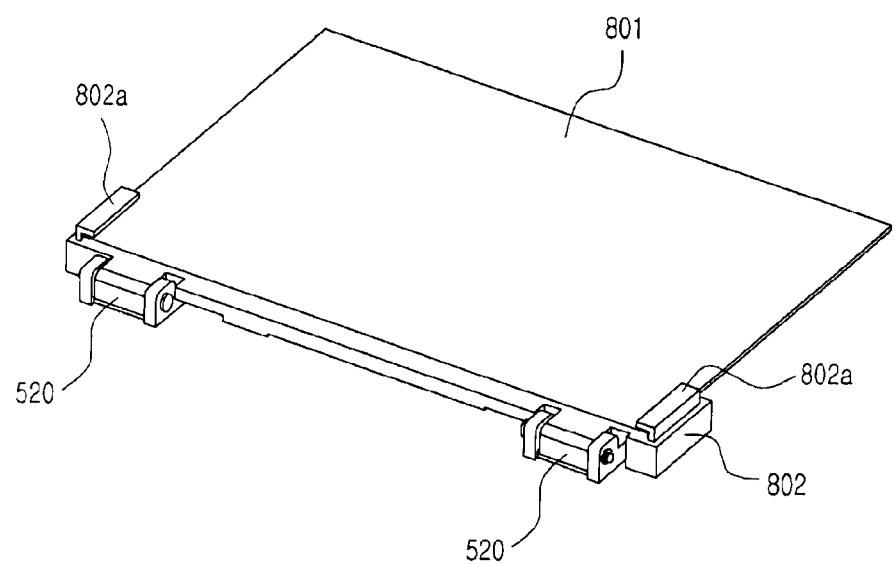
FIG. 18 is a perspective view showing the construction of the cradle apparatus of the portable communication device according to the second embodiment of the present invention in the assembled condition.

Here, as shown in FIGS. 16 to 18, when the second and third housings 300 and 400 are returned to their original positions, the second housing 300 is firstly lowered downward, the moving plate 801 and the tilt hinge unit 530 are lowered downward in unison, and then the sliding unit 802 and the first link unit 531 are lowered in unison.

At this time, the cam 517 of the sliding unit 802 is also lowered, which renders the ball 523a to be introduced into or extracted from the actuation hole 521b, thereby providing a click feeling for the sliding unit 802 and limiting the rotation of the sliding unit 802.

The other end of the first link unit 531 is lifted again to its original position, which lifts one end of the second link unit 532, wherein the other end of the second link unit 532 is lowered through a seesaw movement. The second link unit 532 is rotated about the first axis A1, thereby performing the seesaw movement.

If the other end of the second link unit 532 is lowered, the fourth link unit 534 is also lowered together with the second link unit 532, and as the fourth link unit 534 is lowered, the third housing 400 is also lowered to its original position.

The fourth link unit 534 is rotated about the second axis A2 of the fifth link unit 535, thereby being lowered.

In this state, the second housing 300 is slid again toward the first housing 200, so that the second and third housings 300 and 400 are stacked to be opposite to each other.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus comprising:
 a first housing;
 a second housing including a first display;
 a third housing including a second display, the third housing to be introduced into the first housing and withdrawn from the first housing such that the third housing is arranged at a specific angle in an extension direction from the second housing;
 a swing hinge unit to enable the second housing to be swung out from the first housing while the third housing is arranged at the specific angle in an extension direction from the second housing; and
 a tilt hinge unit to enable the swing hinge to be tiltedly rotated; and
 wherein the third housing is tiltedly arranged when the second housing is swung out from the first housing and the third housing is withdrawn from the first housing.

2. The apparatus of claim 1, wherein the first, housing is formed with a space to cradle the third housing.

3. The apparatus of claim 1, wherein the first and second display are to form a single screen by arranging the second and third housings to be flush with each other.

4. The apparatus of claim 1, wherein the third housing is to connect to a side of the second housing.

5. The apparatus of claim 1, further comprising a plurality of link units provided at each of the opposite ends of the swing hinge unit, so that when the swing hinge unit is tiltedly rotated by the tilt hinge unit, the link units are tiltedly rotated and perform a seesaw movement in such a manner that the third housing is extended from the second housing and tiltedly rotated.

6. The apparatus of claim 5, wherein the link units comprise:
 a first link unit provided at each of the opposite ends of the swing hinge unit in such a manner that the first link unit is tiltedly rotated by the tilt hinge unit;
 a second link unit rotatably joined to the first link unit and a fourth link unit provided on the third housing, the second link unit being rotated about a first axis and performing a seesaw movement when the first link unit is tiltedly rotated;
 a third link unit anchored to the first housing and providing the first axis, the third link unit supporting the seesaw movement of the second link unit;
 the fourth link unit anchored to the third housing so as to rotate the third housing about a second axis in response to the seesaw movement of the second link unit; and
 a fifth link unit anchored to the first housing and providing the second axis, the fifth link unit supporting the third housing in such a manner that the third housing can be tiltedly rotated.

7. The apparatus of claim 5, wherein the swing hinge unit comprises:
 a base member;
 a flat plate joined to the base member in such a manner that the flat plate is tiltedly rotated together with the base member;
 a swing plate anchored to the second housing and joined to the flat plate to be capable of being swung; and
 a pair of elastic members provided in the base member so as to provide elastic force for swinging the swing plate.

8. The apparatus of claim 7, wherein the elastic members are formed from one of a coil spring, a wire spring, a leaf spring and a crank shaft.

9. The apparatus of claim 7, wherein the tilt hinge unit comprises:
 a body housing formed with a screwed part to be screwed to the first housing;
 at least one hinge hole formed at one end of the body housing, and joined with a pair of hinge pines formed on the flat plate to be rotatable about a rotary axis, the hinge hole tiltedly rotating the flat plate; and
 a hinge unit provided within the body housing at a position corresponding to that of a cam formed on the flat plate, the cam and a ball being engaged with or disengaged from each other in response to the rotation of the flat plate, thereby limiting the tilting rotation of the swing hinge unit and providing a click feeling.

10. The apparatus of claim 9, wherein the hinge unit comprises:
 an actuation hole formed in the body housing containing the ball, the ball being introduced into, or extracted from, the actuation hole in response to its engagement with or disengagement from the cam;
 a coil spring provided within the actuation hole so as to provide elastic force for allowing the ball to be introduced into or extracted from the actuation hole; and
 a spring support for supporting the elastic force of the coil spring.

11. The apparatus of claim 7, wherein the flat plate has a stopper formed at one end thereof, which comes into contact with a stopper protrusion formed on the tilt hinge unit and limits the rotation of the swing plate.

12. The apparatus of claim 6, wherein one end of the first link unit is formed with a first connection part connected to one of the opposite ends of the swing unit, another end of the first link unit is formed with a second connection part which is connected to the second link unit in such a manner to be capable of being tiltedly rotated, and a central area of the first link unit is formed with an engagement recess to be engaged with or disengaged from the third link unit as the first link unit is tiltedly rotated.

13. The apparatus of claim 12, wherein one end of the second link unit is formed with a first link hole which is joined to the second connection part formed on the first link unit to be capable of being tiltedly rotated, the central area of the second link unit is formed with a second link hole for supporting the second link unit in such a manner that the second link unit can be rotated about the second axis, thereby performing seesaw movement, and the other end of the second link unit is formed with a third link hole rotatably joined with a rotary joint protrusion formed on the fourth link unit.

14. The apparatus of claim 6, wherein the third link unit comprises:
 at least one third link unit side connection part anchored to the first unit; and
 a rotary protrusion formed at a center of the third link unit and providing the first axis, the rotary protrusion being rotatably fitted in a second link hole.

15. The apparatus of claim 6, wherein the fourth link unit comprises:
 at least one fourth link side connection part joined to the first housing;
 a rotary joint protrusion formed at one end of the fourth link unit, the rotary joint protrusion being rotatably fitted in a third link hole formed at another end of the second link unit; and
 a rotary joint groove formed at another end of the fourth link unit, the rotary joint groove being rotatably joined with a rotary protrusion formed on the fifth link unit.

16. The apparatus of claim 15, wherein the fifth link unit comprises:
- at least one fifth link unit side connection part anchored to the first housing; and
- the rotary protrusion rotatably joined to the rotary joint groove of the fourth link unit and providing the second axis, the rotary protrusion allowing the third housing to be rotated.

17. The apparatus of claim 6, wherein at least one first elastic member is provided between the second and fourth link units so as to provide elastic force for automatically tiltedly rotating the third housing, and
- at least one second elastic member and at least one third elastic member are provided under the second housing and the third housings so as to automatically tiltedly rotate the second housing and the third housing by elastic force.

18. The apparatus of claim 17, wherein the first elastic member is provided within a space formed in the fourth link unit, and fitted on a rotary protrusion formed on the third link unit, the first elastic member providing elastic force for the fourth link unit.

19. An apparatus comprising:
- a first housing;
- a second housing including a first display, the second housing being slidable from the first housing in a state in which the second housing is opposite to the first housing;
- a third housing including a second display, the third housing being stacked with the second housing before the second housing is slid from the first housing and being extendable from the second housing;
- a moving plate anchored to the second housing;
- a sliding unit slidably joined with the moving plate to allow a sliding movement of the moving plate;
- a tilt hinge unit anchored to the first housing so as to tiltedly rotate the moving plate and the sliding unit; and
- a plurality of link units provided at each of the opposite ends of the sliding unit, so that when the moving plate and the sliding unit are tiltedly rotated, the link units are tiltedly rotated and perform a seesaw movement in such a manner that the third housing is extended from the second housing.

20. The apparatus of claim 19, wherein the link units comprise:
- a first link unit provided at one of the opposite ends of the sliding unit being provided with such a first link unit in such a manner that when the moving plate is slid from the first housing, the first link unit is tiltedly rotated by the tilt hinge unit;
- a second link unit rotatably joined to the first link unit and a fourth link unit provided on the third housing, the second link unit being rotated about a first axis and performing a seesaw movement when the first link unit is tiltedly rotated;
- a third link unit anchored to the first housing and providing the first axis, the third link unit supporting the seesaw movement of the second link unit;
- the fourth link unit anchored to the third housing so as to rotate the third housing about a second axis in response to the seesaw movement of the second link unit; and
- a fifth link unit anchored to the first housing and providing the second axis, and the fifth link unit supporting the third housing in such a manner that the third housing can be tiltedly rotated.

* * * * *